United States Patent
Mis et al.

(10) Patent No.: US 6,762,122 B2
(45) Date of Patent: Jul. 13, 2004

(54) METHODS OF FORMING METALLURGY STRUCTURES FOR WIRE AND SOLDER BONDING

(75) Inventors: J. Daniel Mis, Cary, NC (US); Kevin Engel, Durham, NC (US)

(73) Assignee: Unitivie International Limited, Curacao (AN)

( * ) Notice: Subject to any disclaimer, the term of this patent is extended or adjusted under 35 U.S.C. 154(b) by 0 days.

(21) Appl. No.: 09/966,316

(22) Filed: Sep. 27, 2001

(65) Prior Publication Data

US 2003/0057559 A1 Mar. 27, 2003

(51) Int. Cl.[7] .............................................. H01L 21/44
(52) U.S. Cl. ..................................... 438/683; 438/687
(58) Field of Search ................................ 257/762, 738, 257/737, 6, 13, 761; 438/15, 762, 763, 14, 687, 683

(56) References Cited

U.S. PATENT DOCUMENTS

| | | | |
|---|---|---|---|
| 162,257 A | * 11/1875 | Yung | 438/613 |
| 5,162,257 A | * 11/1992 | Yung | 438/613 |
| 5,234,149 A | * 8/1993 | Katz et al. | 228/123.1 |
| 5,886,393 A | * 3/1999 | Merrill et al. | 257/531 |
| 5,892,179 A | 4/1999 | Rinne et al. | |
| 5,902,686 A | * 5/1999 | Mis | 428/629 |
| 6,133,065 A | 10/2000 | Akram | 438/108 |
| 6,208,018 B1 | * 3/2001 | Ma et al. | 257/669 |
| 6,221,682 B1 | * 4/2001 | Danziger et al. | 438/15 |
| 6,222,279 B1 | 4/2001 | Mis et al. | |
| 6,335,104 B1 | * 1/2002 | Sambucetti et al. | 428/615 |
| 6,415,974 B2 | * 7/2002 | Jao | 228/215 |
| 6,419,974 B1 | * 7/2002 | Silva et al. | 426/580 |
| 2001/0011764 A1 | * 8/2001 | Elenius et al | 257/679 |
| 2001/0020745 A1 | * 9/2001 | Jiang et al. | 257/778 |
| 2002/0086520 A1 | * 7/2002 | Chiang | 438/630 |
| 2002/0096764 A1 | * 7/2002 | Huang | 257/737 |
| 2002/0197842 A1 | * 12/2002 | Kuo et al. | 438/613 |
| 2003/0000738 A1 | * 1/2003 | Rumsey et al. | 174/260 |
| 2003/0107137 A1 | * 6/2003 | Stierman et al. | 257/763 |
| 2003/0143830 A1 | * 7/2003 | Akram | 438/612 |

FOREIGN PATENT DOCUMENTS

| | | | | |
|---|---|---|---|---|
| DE | 197 41 436 | | 12/1998 | ........ H01L/23/50 |
| EP | 0 782 191 A2 | * | 2/1997 | ........ H01L/25/065 |
| EP | 0 782 191 | | 7/1997 | ........ H01L/25/065 |
| GB | 0 782 191 A2 | * | 12/1996 | ........ H01L/25/065 |

OTHER PUBLICATIONS

Edelstein, D. C. et al., Derwent Publications Ltd. London, GB: AN 2002–308284 XP–002243726.
International Search Report for PCT/US 02/30697.

* cited by examiner

*Primary Examiner*—Chandra Chaudhari
*Assistant Examiner*—William Vesperman
(74) *Attorney, Agent, or Firm*—Myers, Bigel, Sibly & Sajovec

(57) ABSTRACT

Metallurgy structures for input/output pads of an electronic devices can be adapted to receive both solder and wire bonds. First and second metallurgy structures, for example, can be provided on respective first and second input/output pads of an electronic device such that the first and second common metallurgy structures have a shared structure adapted to receive both solder and wire bonds. A solder bond can thus be applied to the first metallurgy structure, and a wire bond can be applied to the second metallurgy structure.

42 Claims, 5 Drawing Sheets

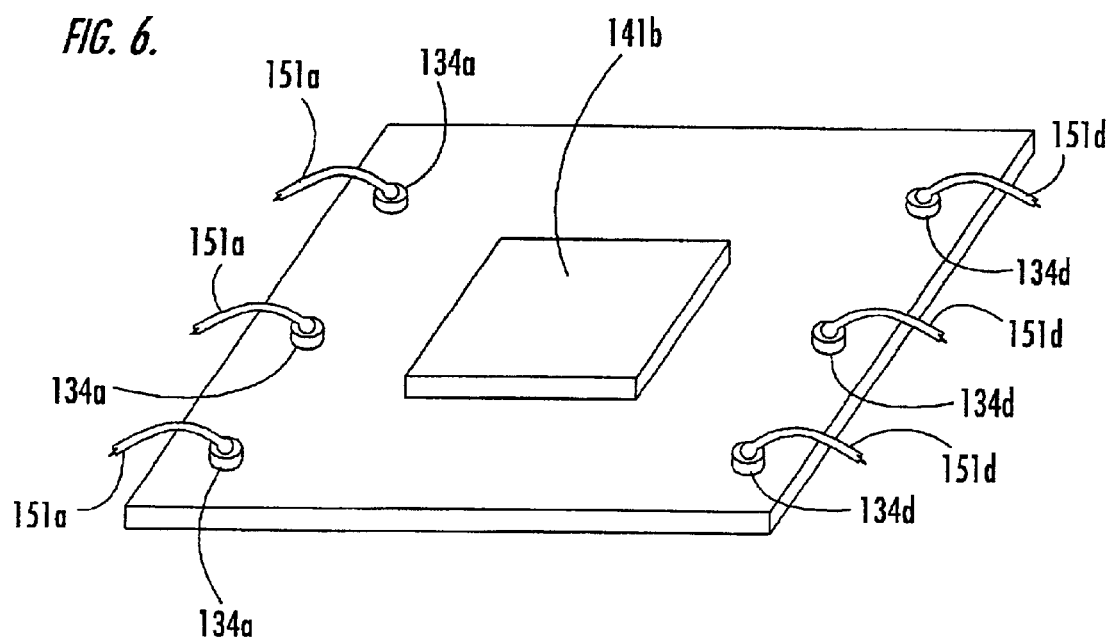

METHODS OF FORMING METALLURGY STRUCTURES FOR WIRE AND SOLDER BONDING

BACKGROUND OF THE INVENTION

The present invention relates to the field of integrated circuits and more particularly to interconnections of integrated circuit devices and related methods and structures.

High performance microelectronic devices often use solder balls or solder bumps for electrical interconnection to other microelectronic devices. For example, a very large scale integration (VLSI) chip may be electrically connected to a circuit board or other next level packaging substrate using solder balls or solder bumps. This connection technology is also referred to as "Controlled Collapse Chip Connection—C4" or "flip-chip" technology, and will be referred to herein as solder bumps.

According to solder bump technology developed by IBM, solder bumps are formed by evaporation through openings in a shadow mask which is clamped to an integrated circuit wafer. For example, U.S. Pat. No. 5,234,149 entitled "Debondable Metallic Bonding Method" to Katz et al. discloses an electronic device with chip wiring terminals and metallization layers. The wiring terminals are typically essentially aluminum, and the metallization layers may include a titanium or chromium localized adhesive layer, a co-deposited localized chromium copper layer, a localized wettable copper layer, and a localized gold or tin capping layer. An evaporated localized lead-tin solder layer is located on the capping layer.

Solder bump technology based on an electroplating method has also been actively pursued. The electroplating method is particularly useful for larger substrates and smaller bumps. In this method, an "under bump metallurgy" (UBM) layer is deposited on a microelectronic substrate having contact pads thereon, typically by evaporation or sputtering. A continuous under bump metallurgy layer is typically provided on the pads and on the substrate between the pads, in order to allow current flow during solder plating.

An example of an electroplating method with an under bump metallurgy layer is discussed in U.S. Pat. No. 5,162,257 entitled "Solder Bump Fabrication Method" to Yung and assigned to the assignee of the present application. In this patent, the under bump metallurgy layer includes a chromium layer adjacent the substrate and pads, a top copper layer which acts as a solderable metal, and a phased chromium/copper layer between the chromium and copper layers. The base of the solder bump is preserved by converting the under bump metallurgy layer between the solder bump and contact pad into an intermetallic of the solder and the solderable component of the under bump metallurgy layer.

SUMMARY OF THE INVENTION

According to aspects of the present invention, metallurgy structures can be provided for input/output pads of an electronic device comprising a substrate, and first and second input/output pads on the substrate. In particular, first and second metallurgy structures can be provided on the respective first and second input/output pads, with the first and second metallurgy structures having a shared metallurgy structure adapted to receive solder and wire bonds. The metallurgy structures can thus be formed efficiently at the same time to facilitate solder bonding to another substrate and wire bonding to a next level packaging structure.

According to additional aspects of the present invention, metallurgy structures according to the present invention can include an underbump metallurgy layer on an input/output pad, a barrier layer on the underbump metallurgy layer, and a passivation layer on the barrier layer. Such a structure can accept either a wire bond or a solder bond.

According to further aspects of the present invention, an electronic device can include a substrate, an input/output pad on the substrate, and a bonding structure on the input/output pad. More particularly, the bonding structure can include a barrier layer comprising nickel on the input/output pad, and a solder structure on the barrier layer.

According to yet further aspects of the present invention, first and second barrier layers can be provided on the respective first and second input/output pads wherein the first and second barrier layers each comprise nickel. First and second passivation layers can be provided on the respective first and second barrier layers, and a solder structure can be provided on the first passivation layer while maintaining the second passivation layer free of solder.

BRIEF DESCRIPTION OF THE DRAWINGS

FIG. 6 is a plan view of the "flip chip" of FIG. 5 bonded to the substrate of FIG. 4.

DETAILED DESCRIPTION

Figure 1A:
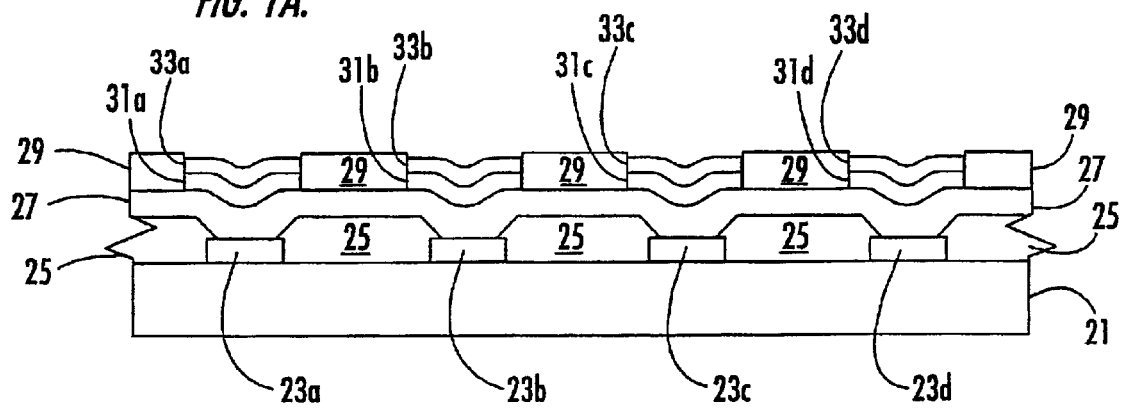
FIGS. 1A–C are cross sectional views illustrating intermediate operations of forming metallurgy structures for input/output pads according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Also, when an element is referred to as being "bonded" to another element, it can be directly bonded to the other element or intervening elements may be present. In contrast, when an element is referred to as being "directly bonded" to another element, there are no intervening elements present.

According to embodiments of the present invention, a shared metallurgy structure can be used to provide both solder bonding and wire bonding for input/output pads. The same fabrication operations can, thus, be used to provide metallurgy on a first input/output pad of a first integrated circuit device for a solder bond and to provide metallurgy on a second input/output pad of the first integrated circuit device for a wire bond. A second integrated circuit device can thus be solder bonded to one or more input/output pads of the first integrated circuit device, and wires can be bonded to one or more other input/output pads of the integrated circuit device without forming different metallurgies for the solder and wire bonds.

Figure 1B:
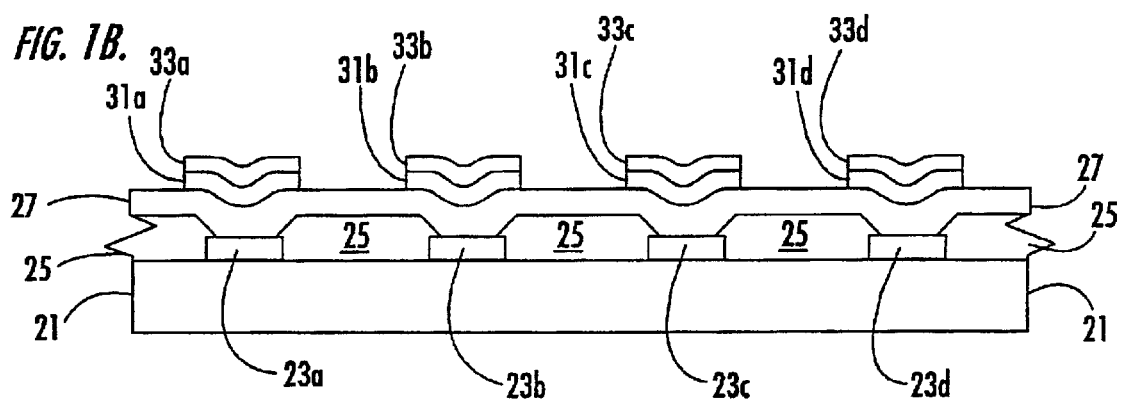
Figure 1C:
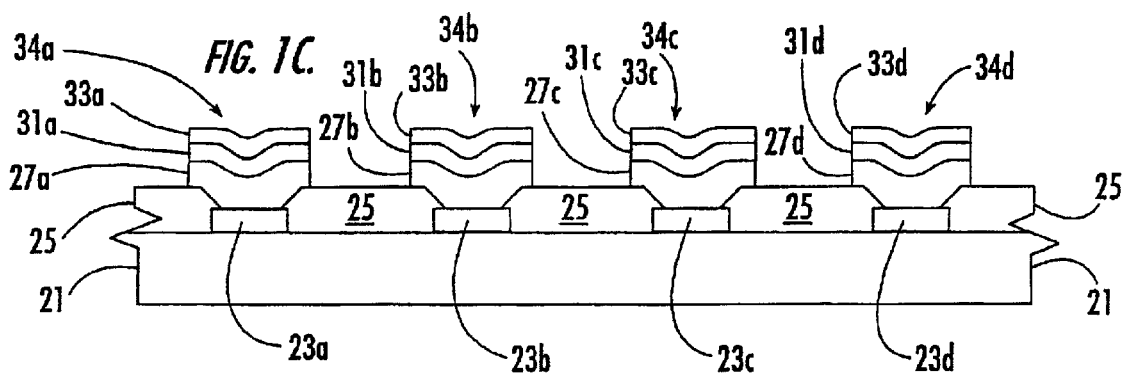

Operations of forming metallurgies for solder and wire bonds are illustrated, by way of example, in FIGS. 1A–C. As shown in FIG. 1A, the integrated circuit device may include a substrate 21, a plurality of input/output pads 23a–d, and a protective insulating layer 25. As will be understood by one of skill in the art, the integrated circuit device may include a plurality of electronic devices formed in/on a semiconductor portion of the substrate 21 with electrical coupling provided with the input/output pads 23a–d. Moreover, the protective insulating layer 25 may be considered a part of the substrate 21. While the protective insulating layer 25 is shown on the input/output pads with portions of the input/output pads being exposed thereby, the input/output pads may be formed on the protective insulating layer, or the integrated circuit device may be provided without a protective insulating layer. The input/output pads may comprise aluminum, copper, or other pad materials known to those having skill in the art.

The integrated circuit device including the substrate, input/output pads, and the protective insulating layer, for example, may be fabricated at a first location, and then shipped to a second packaging facility to provide metallurgy structures according to the present invention. Alternately, metallurgy structures may be provided in the same facility used to fabricate the integrated circuit device including the substrate, the input/output pads, and the protective insulating layer.

As shown in FIG. 1A, an under bump metallurgy layer 27 can be formed to provide adhesion to the input/output pads 23a–d, and/or to provide conduction for subsequent electroplating. The under bump metallurgy layer 27, for example, can include a first adhesion layer of a material such as titanium, tantalum, tantalum nitride, titanium tungsten, and/or titanium nitride on the input/output pads, and a second conduction layer of a material such as copper and/or gold on the adhesion layer. Alternately, separate adhesion and conduction layers may not be needed if a single layer provides sufficient adhesion and/or conduction. The under bump metallurgy layer may be formed by sputtering, evaporation, or any other techniques known to those having skill in the art. Under bump metallurgy layers are further discussed, for example, in U.S. Pat. No. 6,222,279 to Mis et al. entitled "Solder Bump Fabrication Methods And Structures Including A Titanium Barrier Layer", the disclosure of which is hereby incorporated herein in its entirety by reference. The '279 patent is assigned to the assignee of the present invention, and the '279 patent and the present invention share common inventors.

Prior to forming the under bump metallurgy layer, it may be desirable to treat exposed input/output pad 23a–d surfaces to remove surface oxides and/or contamination that might increase contact resistance between the under bump metallurgy layer and the input/output pads. For example, one or more surface treatments such as a wet chemical dip, a sputtering process, and/or a dry etch may be preformed.

A patterned masking layer 29, such as a photoresist layer, can then be formed on the under bump metallurgy layer 27 so that subsequent portions of the metallurgy can be selectively electroplated. The patterned masking layer, for example, may be an organic material such as a spun on resist or a dry film patterned using known photolithographic techniques. Barrier layers 31a–d and passivation layers 33a–d can then be formed by electroplating on portions of the under bump metallurgy layer exposed by the masking layer 29. The barrier layers, for example, can be layers of a material such as nickel, platinum, and/or palladium that can reduce solder diffusion. The passivation layers, for example, can be layers of gold, gold-tin, copper, and/or aluminum that can reduce oxidation of the barrier layer, that can provide a solder wettable surface and that can provide a suitable wire bonding surface. According to particular embodiments, the barrier layers 31a–d can have thicknesses in the range of 0.5 to 2.0 microns, and passivation layers 33a–d can have thicknesses in the range of 0.05 to 2.0 microns. For example, a gold passivation layer having a thickness in the range of 0.05 microns to 2.0 microns can provide a solder wettable surface that is suitable for solder bonding and a surface that is also suitable for wire bonding.

As shown in FIG. 1B, the masking layer 29 can be removed thereby exposing portions of the under bump metallurgy layer. The exposed portions of the under bump metallurgy layer can then be removed as shown in FIG. 1C. The barrier layers and/or passivation layers, for example, can be used as a mask to selectively etch exposed portions of the under bump metallurgy layer. According to particular embodiments, for example, gold passivation layers and nickel barrier layers can be used to mask the under bump metallurgy layer wherein a copper portion of the under bump metallurgy is removed using a $NH_4OH/H_2O_2$ etchant and a titanium portion of the under bump metallurgy layer is removed using a buffered fluoride etch. Alternately, an additional masking layer can be used for the selective removal of the exposed portions of the under bump metallurgy layer.

As shown in FIG. 1C, the resulting metallurgy structures 34a–d include respective under bump metallurgy layers 27a–d, barrier layers 31a–d, and passivation layers 33a–d. Each of these metallurgy structures may be used for solder or wire bonding as discussed in greater detail below. To the best of their knowledge, the inventors are the first to realize that a shared metallurgy structure can be used for solder and wire bonding. Accordingly, the same fabrication operations can be efficiently used to provide metallurgy structures for input/output pads to provide subsequent wire and solder bonding. While an example of such a metallurgy structure is illustrated in FIG. 1C, other metallurgy structures adapted to receive both wire and solder bonds are contemplated according to the present invention.

Moreover, while an example of a method of forming the structure of FIG. 1C is illustrated in FIGS. 1A–C, other methods could alternately be used to provide the structure of FIG. 1C. For example, continuous under bump metallurgy, barrier, and passivation layers could be formed on the substrate including the input/output pads and then selectively etched using photolithographic techniques. The continuous under bump metallurgy, barrier, and passivation layers could be formed using any known deposition techniques such as evaporation, sputtering, electroplating, or combinations thereof. If a technique other than electroplating is used, an under bump metallurgy layer may be provided without a separate conduction layer included therein.

As further shown in the structure of FIG. 1C, the metallurgy structures 34a–d can provide for solder or wire bonding adjacent the respective input/output pads 23a–d.

Alternately, metallurgy structures according to the present invention could provide for solder or wire bonding remote from the respective input/output pad with electrical coupling and redistribution thereto. Redistribution routing conductors are discussed, for example, in U.S. Pat. No. 5,892,179 entitled "Solder bumps and structures for integrated redistribution routing conductors" to Rinne et al., the disclosure of which is hereby incorporated herein in its entirety by reference. In addition, it is noted that U.S. Pat. No. 5,892,179 and the present invention are commonly assigned and U.S. Pat. No. 5,892,179 share a common inventor.

Figure 2A:
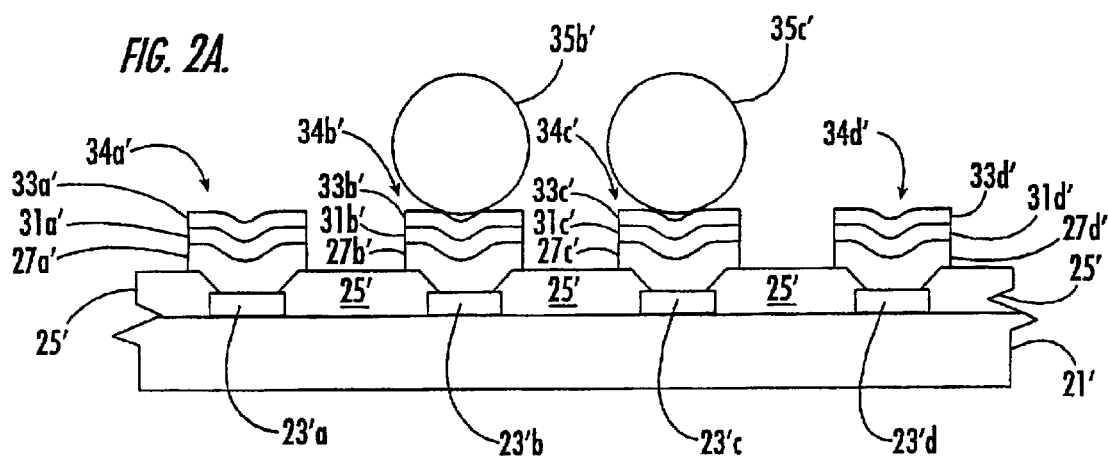
FIGS. 2A–C are cross sectional views illustrating intermediate operations and structures of bonding a second substrate according to embodiments of the present invention.
Figure 2B:
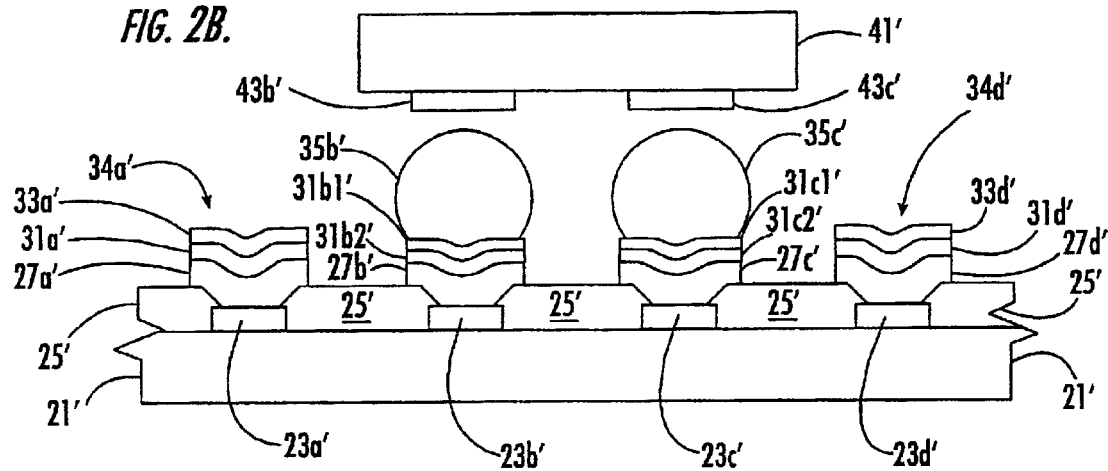
Figure 2C:
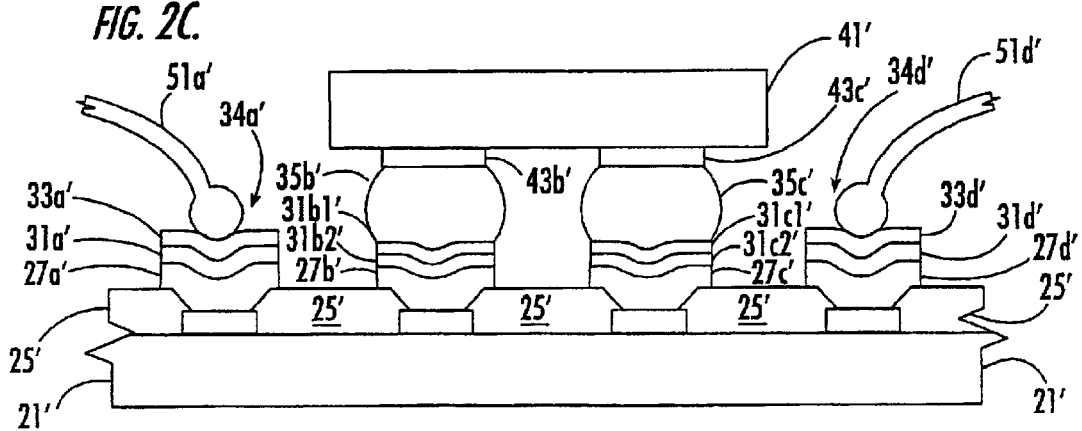

Examples of operations of providing wire and solder bonds to a structure according to FIG. 1C are illustrated in FIGS. 2A–C. Prior to forming wire and/or solder bonds, it may be useful to flux the exposed surfaces of the passivation layers. As shown in FIG. 2A, solder balls may be applied to one or more of the metallurgy structures $34a'$-$d'$ where solder bonds are to be applied. For example, preformed solder structures $35b'$-$c'$ (such as solder balls) may be placed on metallurgy structures $34b'$ and $34c'$ manually or using automated placement tools. Alternately, solder structures could be electroplated, evaporated, or otherwise provided on the metallurgy structures. With the structure of FIG. 1A, for example, a second masking layer could be used to mask the passivation layers $33a$ and $33d$ while electroplating solder structures on the passivation layers metallurgy structures $34b$ and $34c$. The masking layers could then be removed followed by removing the exposed portions of the under bump metallurgy layer to provide the structure of FIG. 2A. Metallurgy structures according to the present invention may be used with a full range of lead/tin solders and/or other tin based solders as well as other solders known to those of skill in the art.

A solder reflow operation can then be performed as shown in FIG. 2B, such that solder is heated above its melting temperature. The reflow operation may cause passivation layers $33b'$-$c'$ to react with the solder structures $35b'$-$c'$, and the passivation layers may diffuse into the solder structures. Solder may also diffuse into the barrier layers to provide first barrier layers $31b1'$ and $31c1'$ of the barrier material and diffused solder and second barrier layers $31b2'$ and $31c2'$ free of diffused solder. As further shown in FIG. 2B, metallurgy structures $34a'$ and $34d'$ can be maintained free of solder for subsequent wire bonding. In addition, the solder surfaces may be cleaned after reflow.

A second integrated circuit substrate $41'$ including pads $43b'$ and $43c'$ thereon may be provided for solder bonding to the first integrated circuit substrate $21'$ using solder structures $35b'$ and $35c'$. The second integrated circuit substrate may include input/output pads and a protective insulating layer similar to those of the first substrate. Moreover, the pads $43b'$ and $43c'$ may include metallurgy structures on input/output pads such that the pads $43b'$ and $43c'$ allow bonding to the solder structures $35b'$ and $35c'$. As shown in FIG. 2B, the second integrated circuit substrate $41'$ including pads $43b'$ and $43c'$ may be brought into alignment with the solder structures $35b'$ and $35c'$, and the pads $43b'$ and $43c'$ can then be brought into contact with the solder structures $35b'$ and $35c'$.

As shown in FIG. 2C, a second reflow operation (heating the solder above its melting temperature) can be performed to provide solder bonding between the first and second substrates $21'$ and $41'$. Each solder structure $35b'$ and $35c'$ can thus provide electrical and mechanical coupling between the two substrates. The metallurgy structures $34a'$ and $34d'$ that are free of solder can be used to provide wire bonding for the respective input/output pads $23a'$ and $23d'$ as further illustrated in FIG. 2C. In particular, the wires $51a'$ and $51d'$ can be bonded to the metallurgy structures $34a'$ and $34d'$ using wire bonding techniques known to those having skill in the art. Moreover, the order of bonding the second substrate and bonding the wires can be changed according to the present invention. For example, the second substrate can be solder bonded to the first substrate followed by bonding the wires so that the alignment of the substrates is not hindered by the wires and so that the wire bonds are not subjected to the heat treatment used to reflow the solder. Alternately, the wires may be bonded followed by solder bonding the two substrates so that the wire bonding is not hindered by the presence of the second substrate.

Figure 3A:
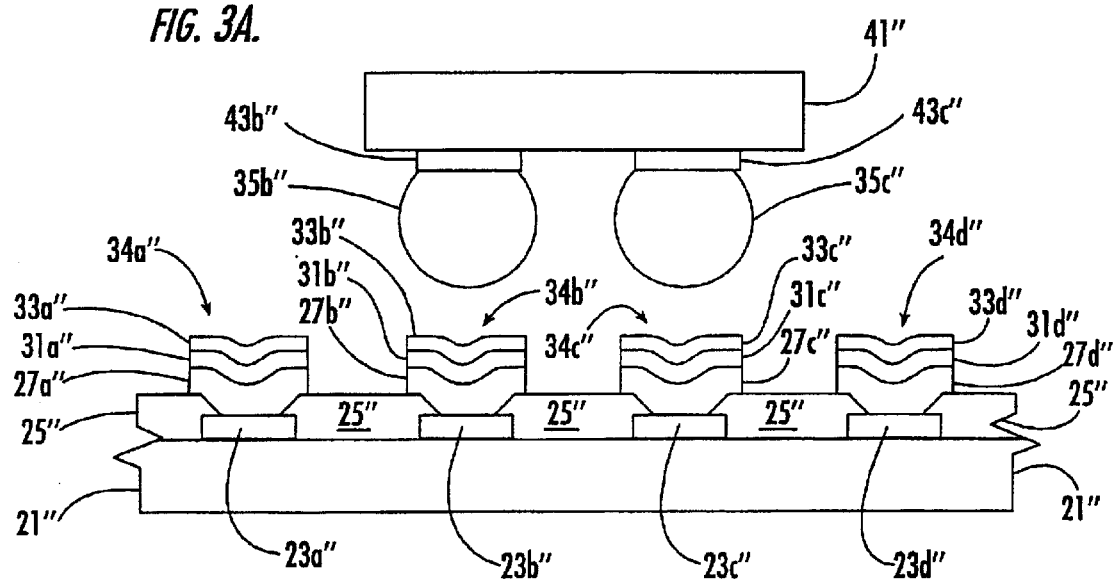
FIGS. 3A–B are cross sectional views illustrating alternate intermediate operations and structures of bonding a second substrate according to embodiments of the present invention.
Figure 3B:
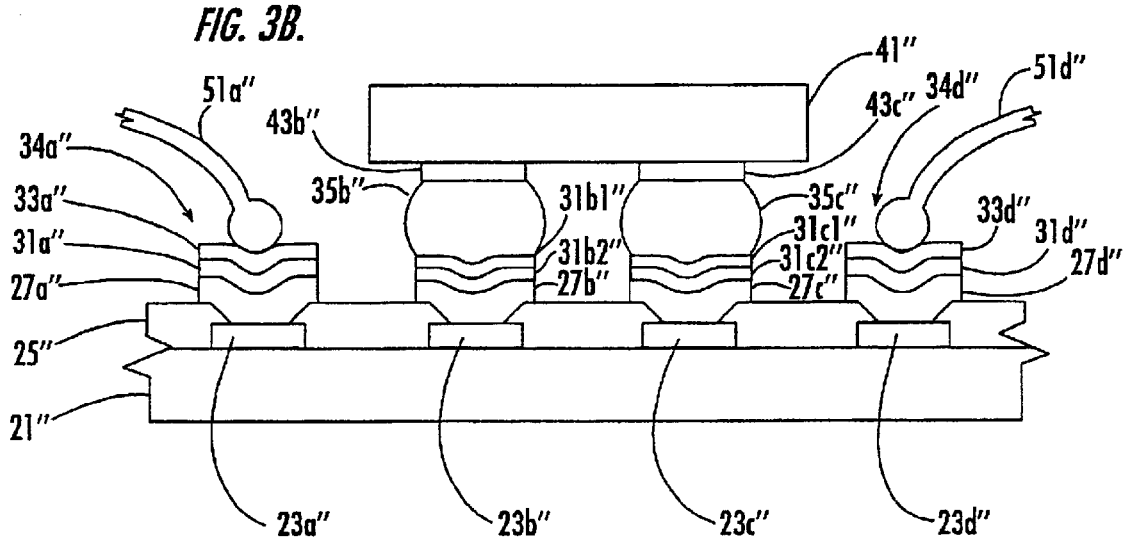

Examples of alternate operations of providing wire and solder bonds to a structure according to FIG. 1C are illustrated in FIGS. 3A–B. As shown in FIG. 3A, the first integrated circuit substrate $21''$ may include input/output pads $23a''$–$d''$ and protective insulating layer $25''$ as discussed above. As further discussed above, metallurgy structures $34a''$–$d''$ can provide solder or wire bonds, and may, for example, include respective under bump metallurgy layers $27a''$–$d''$, barrier layers $31a''$–$d''$, and passivation layers $33a''$–$d''$. These structures can be provided, for example, as discussed above with regard to FIGS. 1A–C.

Solder structures $35b''$ and $35c''$, however, may first be provided on pads $43b''$ and $43c''$ of second integrated circuit substrate $41''$. The solder structures may be provided on the second integrated circuit substrate using solder ball placement, electroplating, evaporation, or other techniques known to those having skill in the art. As shown in FIG. 3A, the solder structures $35b''$ and $35c''$ on the pads $43b''$ and $43c''$ can be brought into alignment with the respective metallurgy structures $34b''$–$c''$.

As shown in FIG. 3B, the solder structures $35b''$ and $35c''$ can then be brought into contact with the respective metallurgy structures $34b''$–$c''$, and a reflow operation performed to provide solder bonds between the first and second substrates. The reflow operation may cause passivation layers $33b''$–$c''$ to react with the solder structures, and the passivation layers $33b''$–$c''$ may diffuse into the respective solder structures $35b''$–$c''$. Solder may also diffuse into barrier layers $31b''$–$c''$ to provide first barrier layers $31b1''$ and $31c1''$ of the barrier material and diffused solder and second barrier layers $31b2''$ and $31c2''$ free of diffused solder. As before, metallurgy structures $34a''$ and $34d''$ can be maintained free of solder for wire bonding.

As further shown in FIG. 3B, wires $51a''$ and $51d''$ can be bonded to metallurgy structures $34a''$ and $34d''$ using techniques known to those having skill in the art. While the wires are discussed as being bonded after solder bonding the second substrate to the first substrate, the wires could be bonded prior to bonding the first and second substrates.

As discussed above with regard to FIGS. 2A–C and 3A–B, two reflow operations can be used to solder bond the two substrates. Alternately, a single reflow operation can be used to bond the solder structures to both substrates at the same, time. For example, solder balls can be placed, solder can be electroplated, or solder can be otherwise provided on one substrate; the substrates can be aligned and brought into contact; and a single reflow operation can be performed to bond the two substrates.

Structures and operations according to the present invention can thus be used to solder bond first and second substrates, and to provide wire bonds to one or both of the substrates. Because a metallurgy structure according to the present invention can be used to receive solder bonds or wire bonds, the same processing operations can be efficiently used to form metallurgy structures for both solder and wire bonding.

Figure 4:
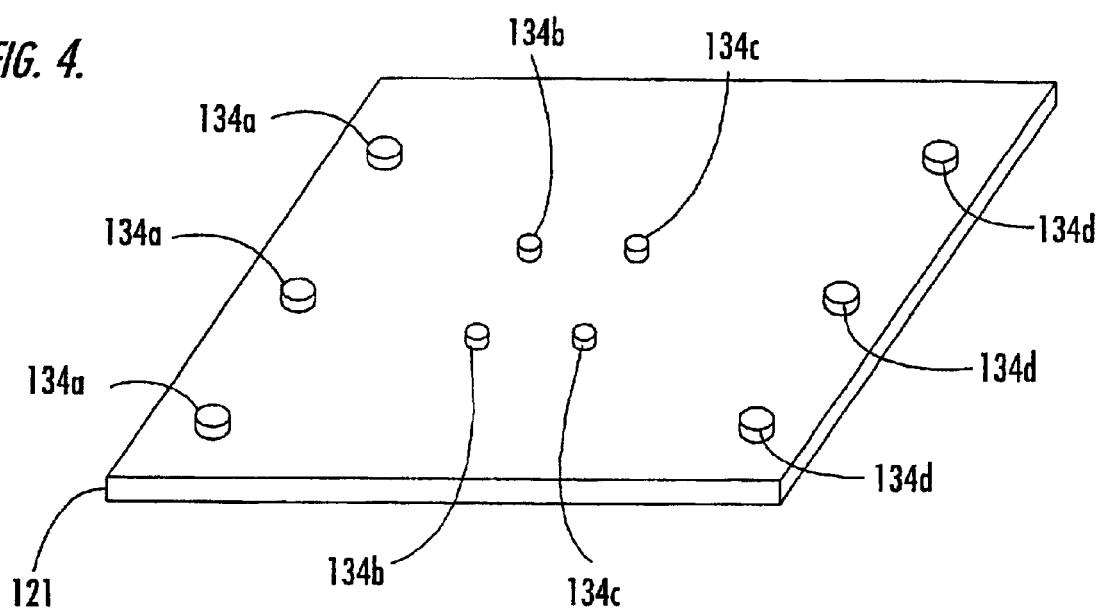
FIG. 4 is a plan view of a substrate including metallurgy structures according to the present invention.
Figure 5:
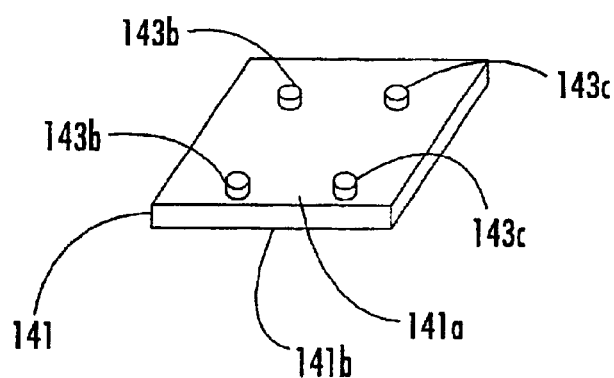
FIG. 5 is a plan view of a "flip chip" to be bonded to the substrate of FIG. 4.

By way of example, a first substrate 121 may have a plurality of metallurgy structures 134a–d wherein each of the metallurgy structures may accept either a solder bond or a wire bond as shown in FIG. 4. Because all of the metallurgy structures have a shared structure, the metallurgy structures can be efficiently and simultaneously provided using the same processing operations. A second substrate 141, including front and back sides 141a and 141b, may include pads 143b–c adapted for solder bonding as shown in FIG. 5. The pads 143b–c may have structures similar to that of metallurgy structures 134a–d or the pads may have other structures suitable for solder bonding.

The pads 143b–c and the metallurgy structures 134b–c have a mating arrangement such that the pads 143b–c and the metallurgy structures 134b–c can be aligned and solder bonded as shown in FIG. 6. In particular, solder can be provided on pads 143b–c and/or the metallurgy structures 134b–c. The substrate 141 can then be "flipped" and aligned with the substrate 121; the pads 143b–c and the metallurgy structures 134b–c can be brought into proximity with solder therebetween; and a reflow operation can be performed to bond the two substrates. Accordingly, the back side 141b of the substrate 141 is visible in FIG. 6 with the pads 143b–c and the metallurgy structures 134b–c between the first and second substrates 141 and 121.

The metallurgy structures 134a and 134d are free of solder and can be used for bonding wires 151a and 151d as further shown in FIG. 6. Accordingly, the two substrates 121 and 141 can be electrically and mechanically coupled using solder bonds between pads 143b–c and metallurgy structures 134b–c, and the substrate 121 can be electrically coupled with a next level packaging structure using wires 151a and 151d. The substrate 121, for example, may be mechanically coupled to a next level packaging substrate such as a printed circuit board with electrical coupling being provided by the wires 151a and 151d.

Each of the various operations such as providing a first substrate including input/output pads, forming metallurgy structures, providing solder, bonding a second substrate to the first substrate, and bonding wires to the first substrate discussed above can be performed in one or more processing locations. For example, a chip fabrication facility may be used to provide the first substrate including the input/output pads, a bumping facility may be used to provide the metallurgy structures on the first substrate, and a packaging facility may be used to bond the first and second substrates and to bond wires. Moreover, one or more of these different facilities may be owned by different commercial entities.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of providing metallurgy structures for input/output pads of an electronic device comprising a substrate including semiconductor portions thereof, and first and second input/output pads on the substrate, the method comprising:

providing first and second metallurgy structures on the respective first and second input/output pads, the first and second metallurgy structures having a shared metallurgy structure adapted to receive solder and wire bonds, wherein providing the metallurgy structures comprises providing underbump metallurgy layers on the respective input/output pads, providing barrier layers on the underbump metallurgy layers, and providing passivation layers on the barrier layers.

2. A method according to claim 1 wherein providing underbump metallurgy layers comprises:

providing adhesion layers on the respective input/output pads; and providing conduction layers on the adhesion layers.

3. A method according to claim 2 wherein the adhesion layers comprise titanium layers, and wherein the conduction layers comprise copper layers.

4. A method according to claim 1 wherein providing underbump metallurgy layers comprises providing a continuous underbump metallurgy layer on the substrate and on the first and second input/output pads.

5. A method according to claim 4 wherein providing the barrier layers comprises selectively electroplating the barrier layers on the underbump metallurgy layer and wherein providing the passivation layers comprises selectively electroplating the passivation layers on the barrier layer.

6. A method according to claim 5 wherein providing the passivation layers is followed by:

removing portions of the continuous underbump metallurgy layer not covered by the barrier layers and the passivation layers.

7. A method according to claim 1 wherein the barrier layers comprise nickel layers.

8. A method according to claim 7 wherein the barrier layers have a thickness in a range of 0.5 microns to 2.0 microns.

9. A method according to claim 1 wherein the passivation layers comprise gold layers.

10. A method according to claim 9 wherein the gold layers have a thickness in a range of 0.05 microns to 2.0 microns.

11. A method of providing metallurgy structures for input/output pads of an electronic device comprising a substrate including semiconductor portions thereof, and first and second input/output pads on the substrate, the method comprising:

providing first and second metallurgy structures on the respective first and second input/output pads, the first and second metallurgy structures having a shared metallurgy structure adapted to receive solder and wire bonds wherein the electronic device further comprises a protective insulating layer on the substrate and on portions of the first and second input/output pads so that portions of the input/output pads are exposed through the protective insulating layer.

12. A method according to claim 11 further comprising:

providing a solder structure on the first metallurgy structure opposite the substrate; and maintaining the second metallurgy structure free of solder.

13. A method according to claim 12 further comprising:

bonding a wire to the second metallurgy structure; and bonding a second substrate to the first substrate via the solder structure, wherein the wire is bonded to the second metallurgy structure and the second substrate is bonded to the first substrate at a same time.

14. A method according to claim 12 further comprising:

bonding a wire to the second metallurgy structure.

15. A method according to claim 12 further comprising:

bonding a second substrate to the first substrate via the solder structure.

16. A method according to claim 11 wherein the first and second metallurgy structures comprise a gold layer on a surface thereof opposite the input/output pads.

17. A method for providing a metallurgy structure for an input/output pad of an electronic device comprising a substrate and an input/output pad on the substrate, the method comprising;
 providing an underbump metallurgy layer on the input/output pad;
 providing a barrier layer on the underbump metallurgy layer; and
 providing a passivation layer on the barrier layer;
 wherein providing the underbump metallurgy layer comprises:
  providing an adhesion layer on the input/output pad; and
  providing a conduction layer on the adhesion layer.

18. A method according to claim 17 wherein providing the adhesion layer comprises providing a titanium layer, and wherein providing the conduction layer comprises providing a copper layer.

19. A method according to claim 17 wherein the barrier layer comprises a nickel layer.

20. A method according to claim 19 wherein the barrier layer has a thickness in a range of 0.5 microns to 2.0 microns.

21. A method according to claim 17 wherein the passivation layer comprises a gold layer.

22. A method according to claim 21 wherein the gold layer has a thickness in a range of 0.05 microns to 2.0 microns.

23. A method according to claim 17 further comprising:
 providing a solder structure on the metallurgy structure opposite the substrate.

24. A method according to claim 23 wherein the electronic device comprises a second input/output pad on the substrate, the method further comprising:
 providing a second underbump metallurgy layer on the second input/output pad;
 providing a second barrier layer on the second underbump metallurgy layer; and
 providing a second passivation layer on the second barrier layer; and
 bonding a wire to the second passivation layer.

25. A method according to claim 24 wherein the first under bump metallurgy layer, the first barrier layer, and the first passivation layer comprise a first metallurgy structure, wherein the second underbump metallurgy layer, the second barrier layer, and the second passivation layer comprise a second metallurgy structure, and wherein the first and second metallurgy structures have a shared metallurgy structure adapted to receive solder and wire bonds.

26. A method according to claim 23 further comprising:
 bonding a second substrate to the first substrate via the solder structure.

27. A method according to claim 23 wherein the electronic device comprises a second input/output pad on the substrate, the method further comprising:
 providing a second underbump metallurgy layer on the second input/output pad;
 providing a second barrier layer on the second underbump metallurgy layer;
 providing a second passivation layer on the second barrier layer;
 bonding a wire to the second passivation layer; and
 bonding a second substrate to the first substrate via the solder structure so that the wire and the second substrate and bonded to the first substrate at a same time.

28. A method according to claim 17 further comprising:
 a protective insulating layer on the substrate and on portions of the input/output pad so that portions of the input/output pad are exposed through the protective insulating layer.

29. A method according to claim 17 wherein the passivation layer is adapted to receive solder and wire bonds.

30. A method for providing bonding structures for input/output pads of an electronic device comprising a substrate and first and second input/output pads on the substrate, the method comprising:
 providing first and second under bump metallurgy layers on the respective first and second input/output pads;
 providing first and second barrier layers on the respective first and second under bump metallurgy layers wherein the first and second barrier avers each comprise nickel wherein the first and second barrier layers have a same thickness wherein the first and second under bump metallurgy layers are between the first and second barrier layers and the first and second input/output pads;
 providing first and second passivation layers on the respective first and second barrier layers wherein the first and second passivation layers comprise a same material other than nickel and have a same thickness; and
 providing a solder structure on the first passivation layer while maintaining the second passivation layer free of solder.

31. A method for providing bonding structures for input/output pads of an electronic device comprising a substrate and first and second input/output pads on the substrate, the method comprising:
 providing first and second barrier layers on the respective first and second input/output pads wherein the first and second barrier layers each comprise nickel wherein the first and second barrier layers have a same thickness;
 providing first and second passivation layers on the respective first and second barrier layers wherein the first and second passivation layers comprise a same material other than nickel and have a same thickness;
 providing a solder structure on the first passivation layer while maintaining the second passivation layer free of solder; and
 reflowing the solder structure so that the first passivation layer diffuses into the solder structure.

32. A method according to claim 31 wherein during reflowing the solder structure, lead from the solder structure diffuses into a portion of the first barrier layer.

33. A method according to claim 31 further comprising:
 bonding a wire to the second passivation layer.

34. A method according to claim 33 further comprising:
 bonding a second substrate to the first substrate via the solder structure so that the wire and the second substrate are bonded to the first substrate at a same time.

35. A method according to claim 31 wherein the passivation layer comprises a gold layer.

36. A method according to claim 31 further comprising:
 bonding a second substrate to the first substrate via the solder structure.

37. A method according to claim 31 wherein the first barrier layer and the first passivation layer comprise a first metallurgy structure, wherein the second barrier layer and the second passivation layer comprise a second metallurgy structure, and wherein the first and second metallurgy structures have a shared metallurgy structure adapted to receive solder and wire bonds.

38. A method of forming an electronic device comprising:

forming first and second input/output pads on a substrate;

forming first and second under bump metallurgy layers on the first and second input/output pads;

forming a first bonding structure on the first under bump metallurgy layer so that the first under bump metallurgy layer is between the first bonding structure and the first input/output pad, the first bonding structure including a first barrier aver comprising nickel on the first under bump metallurgy layer, and a solder structure on the first barrier layer;

forming a second bonding structure on the second under bump metallurgy layer so that the second under bump metallurgy layer is between the second bonding structure and the second input/output pad, the second bonding structure including a second barrier layer comprising nickel on the second under bump metallurgy layer, and a gold layer on the second barrier aver comprising nickel;

bonding a wire to the second bonding structure; and bonding a second substrate to the solder structure so that the wire and the second substrate are bonded to the first substrate at a same time.

39. A method according to claim 38 wherein the under bump metallurgy layers each comprise an adhesion layer on the respective input/output pad, and a conduction layer on the adhesion layer.

40. A method according to claim 39 wherein the adhesion layer comprises a titanium layer, and wherein the conduction layer comprises a copper layer.

41. A method of forming an electronic device comprising:

forming first and second input/output pads on a substrate;

forming a first bonding structure on the first input/output pad, the first bonding structure including a first barrier layer comprising nickel on the first input/output pad, and a solder structure on the first barrier layer;

forming a second bonding structure on the second input/output pad, the second bonding structure including a second barrier layer comprising nickel on the second input/output pad and a gold layer on the second barrier layer comprising nickel;

bonding a wire to the second bonding structure; and bonding a second substrate to the solder structure so that the wire and the second substrate are bonded to the first substrate at a same time;

wherein the first barrier layer comprises a nickel layer free of lead and an alloy layer including nickel and lead between the nickel layer free of lead and the solder structure.

42. A method of forming an electronic device comprising:

forming first and second input/output pads on a substrate;

forming a protective insulating layer on the substrate and on portions of the first and second input/output pads so that portions of the first and second input/output pads are exposed through the protective insulating layer;

forming a first bonding structure on the first input/output pad, the first bonding structure including a first barrier layer comprising nickel on the input/output pad, and a solder structure on the first barrier layer;

forming a second bonding structure on the second input/output pad, the second bonding structure including a second barrier layer comprising nickel on the second input/output pad, and a cold layer on the second barrier layer comprising nickel;

bonding a wire to the second bonding structure; and bonding a second substrate to the solder structure so that the wire and the second substrate are bonded to the first substrate at a same time.

* * * * *

UNITED STATES PATENT AND TRADEMARK OFFICE
CERTIFICATE OF CORRECTION

PATENT NO. : 6,762,122 B2
DATED : July 13, 2004
INVENTOR(S) : Mis et al.

It is certified that error appears in the above-identified patent and that said Letters Patent is hereby corrected as shown below:

Column 11,
Line 15, should read -- first barrier layer comprising nickel on the first under --
Line 24, should read -- and a gold layer on the second barrier layer comprising --

Colum 12,
Line 31, should read -- input/output pad, and a gold layer on the second barrier --

Signed and Sealed this

Seventh Day of December, 2004

JON W. DUDAS
*Director of the United States Patent and Trademark Office*